(12) United States Patent
Ossimitz (10) Patent No.: US 7,560,801 B2
(45) Date of Patent: Jul. 14, 2009

(54) REWIRING SUBSTRATE STRIP WITH SEVERAL SEMICONDUCTOR COMPONENT POSITIONS

(75) Inventor: Peter Ossimitz, München (DE)

(73) Assignee: Infineon Technologies AG, Munich (DE)

( * ) Notice: Subject to any disclaimer, the term of this patent is extended or adjusted under 35 U.S.C. 154(b) by 378 days.

(21) Appl. No.: 10/564,649

(22) PCT Filed: Apr. 19, 2005

(86) PCT No.: PCT/DE2005/000714

§ 371 (c)(1),
(2), (4) Date: Aug. 9, 2006

(87) PCT Pub. No.: WO2005/103729

PCT Pub. Date: Nov. 3, 2005

(65) Prior Publication Data

US 2007/0051984 A1 Mar. 8, 2007

(30) Foreign Application Priority Data

Apr. 22, 2004 (DE) .................. 10 2004 020 187

(51) Int. Cl.
| | |
|---|---|
| H01L 23/544 | (2006.01) |
| H01L 23/58 | (2006.01) |
| H01L 21/768 | (2006.01) |
| H01L 21/66 | (2006.01) |
| H01L 21/50 | (2006.01) |
| H01L 21/44 | (2006.01) |
| H01L 21/7846 | (2006.01) |

(52) U.S. Cl. .......... 257/620; 257/48; 257/E21.596; 257/E21.599; 438/462; 438/14; 438/113; 438/460

(58) Field of Classification Search ............. 257/620, 257/48, E21.596, E21.599; 438/14, 113, 438/460, 462
See application file for complete search history.

(56) References Cited

U.S. PATENT DOCUMENTS

| | | | |
|---|---|---|---|
| 4,467,400 A | | 8/1984 | Stopper |
| 5,168,348 A | * | 12/1992 | Chu et al. ................ 257/713 |
| 5,436,097 A | * | 7/1995 | Norishima et al. .......... 430/5 |
| 6,358,776 B1 | | 3/2002 | Takehara et al. |
| 6,380,729 B1 | | 4/2002 | Smith |
| 6,686,224 B2 | | 2/2004 | Higashi |
| 7,068,833 B1 | * | 6/2006 | Ghinovker et al. ......... 382/144 |
| 2001/0042901 A1 | | 11/2001 | Maruyama |
| 2003/0141860 A1 | | 7/2003 | Chi et al. |
| 2003/0237061 A1 | | 12/2003 | Miller et al. |
| 2005/0265017 A1 | | 12/2005 | Ronn et al. |

FOREIGN PATENT DOCUMENTS

| | | |
|---|---|---|
| DE | 42 32 268 | 3/1994 |
| DE | 103 10 536 | 1/2004 |
| WO | 03/075344 | 9/2003 |

* cited by examiner

*Primary Examiner*—Laun C Thai
(74) *Attorney, Agent, or Firm*—Dicke, Billig, Czaja, PLLC (57) ABSTRACT

A rewiring substrate strip and a method of producing a rewiring substrate strip is disclosed. In one embodiment, the rewiring substrate strip has several semiconductor component positions for semiconductor components. The semiconductor component positions are arranged in rows and columns. In this arrangement, several semiconductor component positions are combined to form one component group. The semiconductor components of a component group are arranged with respect to one another in such a manner that an individual semiconductor component is rotated by 90° with respect to four adjacent semiconductor components.

24 Claims, 3 Drawing Sheets

REWIRING SUBSTRATE STRIP WITH SEVERAL SEMICONDUCTOR COMPONENT POSITIONS

CROSS-REFERENCE TO RELATED APPLICATION

This Utility Patent Application claims the benefit of the filing date of Application No. DE 10 2004 020 187.0, filed Apr. 22, 2004 and International Application No. PCT/DE2005/000714 filed Apr. 19, 2005, both of which are herein incorporated by reference.

FIELD OF THE INVENTION

The invention relates to a rewiring substrate strip with several semiconductor component positions and semiconductor components of the rewiring substrate strip, which are arranged in rows and columns on the rewiring substrate strip, and to a method for producing these.

BACKGROUND

For semiconductor components, it is increasingly aimed at minimizing the product package size produced. For this purpose, the number of outside contacts is reduced to a minimum and it is attempted to avoid as many outside contacts of a semiconductor component, previously provided for test optimization purposes and analysis purposes, as possible. Such a reduction in outside contacts is associated with the disadvantage that outside contacts for internal test and analysis purposes are no longer provided externally on the package. Although this results in small product packages, at the same time this also disadvantageously results in significant restrictions in the analysis and testability of such semiconductor components and their intermediate product stages.

The associated risks with respect to the yield of operable semiconductor components from a rewiring substrate strip cannot be compounded by further improved production methods. The art thus distinguishes between a product package which has the minimum required number of external contacts, and a so-called debugging package, the debugging package having additional removable test contacts which, after a test for operability, are separated from the actual production package.

If in addition to the external contacts of the product package, test areas are provided on a debugging component which is larger than the product component, a variety of possibilities for testing the component are obtained by adding test contact surfaces in edge areas of the debugging component. However, this creates an increased requirement of surface with the increasing number of test surfaces between the semiconductor components of a component group of a rewiring substrate strip.

SUMMARY

The present invention provides a rewiring substrate strip with a number of semiconductor component positions by means of which the above problems can be overcome. In this context, an analysis and testability of internal signals for process optimization, for correlation with other package shapes and for characterizing the semiconductor components should be retained in spite of the reduced number of external contacts and reduced package size. Furthermore, an optimized arrangement and alignment of semiconductor components in the semiconductor component positions should be created which provide for reduced product package size and optimized size of the debugging components. Finally, tests without damage to or deformation of external contacts should become possible. In addition, the present invention provides a simple and inexpensive solution for mechanical and electrical contact arrangements of semiconductor components or of semiconductor modules of a large package scale integrated circuit for a "burn-in" test.

According to one embodiment of the invention, a rewiring substrate strip with several semiconductor component positions for semiconductor components is created and a method for producing it is specified. The semiconductor components are arranged in several component rows and component columns, subdivided by cutting lines, on the rewiring substrate strip. For this purpose, several semiconductor component positions are combined to form one component group. The semiconductor component group comprises several semiconductor chips of the semiconductor components on a top side of the rewiring substrate strip. Within a component group, cutting strips, which are bounded by cutting lines and comprise the test contact surfaces are provided between the component rows and component columns.

The semiconductor component positions including their test contact surfaces are aligned with respect to one another in such a manner that a parquetting pattern according to a parallel-rod parquett pattern is produced. The arrangements of external contacts and test contact surfaces of the semiconductor components are arranged and aligned with respect to one another in accordance with the parquetting pattern in such a manner that four next neighbors of a semiconductor component comprise an arrangement of the external contacts which is aligned rotated by uniformly 90° or by uniformly 270° with respect to the arrangement of the individual semiconductor component.

The rewiring substrate strip has the advantage that the surface to be provided for a component group is optimized in such a manner that as many test contact surfaces as possible can be provided in corresponding cutting strip sections for each of the component positions. Furthermore, the alignment of the four next neighbors of a semiconductor chip rotated by uniformly 90° or uniformly 270° with respect to the semiconductor chip has the result that the connecting lines between external contacts and test surfaces can be optimized in length and density.

Such connecting lines between external contacts of the product package and test contact surfaces of the debugging package can be advantageously implemented both on the top side of the rewiring substrate strip and on the rear side of the rewiring substrate strip in the form of rewiring lines. The rear side is advantageously selected when the test is to be done on the side of the external contacts, and the top side is used for the rewiring lines and for the test contact surfaces if the testing is to take place on the top side, opposite to the external contacts, of the rewiring substrate strip on which the semiconductor chips are also located. The uniformly rotated alignment of four next neighbors with respect to a semiconductor chip also has the advantage that when the top side of the rewiring substrate strip is equipped with semiconductor chips, the automatic insertion machine only has to perform two alignments of the semiconductor chips rotated by a fixed angle with respect to one another, or only two predetermined alignments of the semiconductor chips by the automatic insertion machine of a correspondingly prepared semiconductor wafer or a correspondingly prepared intermediate carrier or of a correspondingly prepared conveyor belt have to be accommodated.

In a further embodiment of the invention, component rows and component columns of a component group comprise first and second semiconductor chips. In this arrangement, the first and second semiconductor chips differ in their alignments. The first semiconductor chips have a first alignment A whereas the second semiconductor chips uniformly have an alignment B which is rotated either by 90° or uniformly by 270° with respect to the first alignment A. The first and second semiconductor chips are then alternately arranged in the component rows and component columns.

Thus, e.g., each odd-number semiconductor component position in the component rows and component columns of a component group can advantageously have the alignment A. Correspondingly, the even-number semiconductor component positions in the component rows and component columns of a component group then have the alignment B. This is associated with the advantage that the arrangement of the external contacts on the rear side of the semiconductor chip is aligned in exactly the same manner as the semiconductor chips on the top side of the rewiring substrate strip which advantageously simplifies the rewiring structure within the rewiring substrate strip and/or on its top side and its rear side.

In one embodiment of the invention, external contact patches having external contact in the semiconductor positions are arranged on a rear side of the rewiring substrate strip opposite to the top side. These external contact patches belong to a rewiring structure which has rewiring lines. These rewiring lines of the rewiring structure connect the external contact patches to the test contact surfaces on the cutting strips of the rewiring substrate strip.

This embodiment of the invention has the advantage that the rewiring substrate strip can be produced relatively inexpensively, especially since it only needs a rewiring structure with rewiring line to the test contact surfaces on its rear side on which the external contact patches are to be provided, in any case. Correspondingly, only those metallic structures which enable the rewiring substrate strip to be connected to the semiconductor chips in each of the semiconductor component positions are necessary on the top side of the rewiring substrate strip, and plated-through contacts to the external contact patches on the rear side of the rewiring substrate strip are required. Thus, both the rear side and the top side of the rewiring substrate strip can be patterned with conventional technologies also known from circuit board production, which reduces the costs for the rewiring substrate strip.

In a further embodiment of the invention, the respective semiconductor component positions are associated with cutting strip sections which carry the test contact surfaces and are arranged on two opposite edges of the product package. This is associated with the advantage that a rectangular debugging package is also produced for a product package with square outline, which forms the basis for a parallel-rod Parquet pattern. In this pattern, intersection areas are created which are formed by the intersection of horizontal and vertical cutting strips along the component rows and the component columns.

In a further embodiment of the invention, these intersection areas can also be used for arranging test contact surfaces for optimum utilization of the surface of a component group. For this purpose, a quarter of these test contact surfaces on an intersection area is in each case allocated to one of the four adjoining semiconductor component positions. This advantageously increases the possible number of test contact surfaces per semiconductor component position, especially since, according to the parketting pattern, four intersection areas adjoin one semiconductor position which increases the surface of the semiconductor positions which can be utilized for test contact surfaces by one entire intersection area per component position.

It is also provided that a number of component groups are arranged in a row behind one another and/or next to one another on the rewiring substrate strip and preferably have one or more plastic covers. Such plastic covers are required, in particular, if the electrical connections between semiconductor chip and rewiring substrate strips are produced by means of bonding technology and thus by means of sensitive bonding wires. These plastic covers on the component groups safeguard and protect such bonding wires of the bonding connections between semiconductor chip and rewiring substrate strip.

Another possible connection between semiconductor chip and rewiring substrate strip is possible by means of the so-called flip-chip technology. For this purpose, contact surfaces on the active top side of the semiconductor chip, which are otherwise available for bonding connections, are provided with flip-chip contacts which can be soldered directly to corresponding contact pads on the rewiring substrate strip. Since a relatively stable soldering connection is achieved in this embodiment of the invention via the flip-chip contacts between the semiconductor chip and the rewiring substrate strip with corresponding contact pads, packages without protective plastic cover are also possible in this embodiment of the invention.

In a further embodiment of the invention, it is provided that the rewiring substrate strip has on its rear side, outside the area of a component group, areas with exposed test contact surfaces. These test contact surfaces are electrically connected to the test contact surfaces in the cutting strips and/or the external contact patches of the semiconductor components and/or to contact areas on the active side of the semiconductor chips via rewiring lines. This embodiment of the invention has the advantage that measurements and tests previously not provided can be additionally performed on the rewiring substrate strip via these additional test contact surfaces outside the component groups. Whilst the surface of a component group is optimized and minimized, the rewiring substrate strip has sufficiently large surfaces outside a component group for providing such additional test contact surfaces. This makes it possible advantageously to expand the analyses and tests of the individual integrated circuits.

A further improvement of the testing capabilities for the rewiring substrate strip consists in that in the edge area of the rewiring substrate strip, a test contact strip is provided for a component group for a temperature cycle test or, respectively, "burn-in" test. For this so-called "burn-in" test, characteristic semiconductor component elements on the semiconductor chip are connected to the plug-in contact strip via a bunch of corresponding rewiring lines so that it is not necessary to prepare individual components for the "burn-out" test but these temperature cycle tests can be performed for entire component groups on the rewiring substrate strip. Such a plug-in contact strip can be arranged both on the rear side and on the top side of the rewiring substrate strip. In this arrangement, the individual plug-in contact surfaces of a plug-in contact strip can be electrically connected to the test contact surfaces and/or the external contact patches and/or the contact areas of an active top side of a semiconductor chip. In addition, other rewiring lines can be connected to the plug-in contact strip in order to perform additional functional tests of the individual semiconductor components of a semiconductor component group via the plug-in contact strip.

Instead of providing for contacting via the plug-in contact strip, the test contact surfaces can also be connected either directly to corresponding test probes, or test contacts are applied to the test contact surfaces. Such applied test contacts have the advantage that the test probes, in the form of measuring tips, do not need to be applied to the external contacts or to the test contact surfaces of a product package or, respectively a debugging package. The external contacts of a product package or, respectively, the test contact surfaces of a debugging package are thus neither contaminated by the measuring tips nor are the measuring tips conversely contaminated by the external contacts or, respectively, the test contact surfaces.

To further reduce the risk of contamination of the measuring tips by test contact surfaces or test contacts, test contact surfaces or test contacts can be covered with gold plating in a further embodiment of the invention. Such gold plating of the test contact surfaces or of the test contacts also improves the contact resistance of the contact, especially since gold does not oxidize in air like aluminum or copper or is sulfidized in air like silver.

A further embodiment of the invention makes it possible, especially by providing debugging packages with a correspondingly high number of test contact surfaces, to test rewiring substrate strips with a stack of a logic chip and a memory chip in the semiconductor component positions. In this context, both the memory functions of the memory chip and the logic functions of the logic chip can be tested via the test contact surfaces and/or the exposed test contact surfaces and/or via the plug-in contact strips even before the rewiring substrate strip is packaged and processed further to form individual semiconductor components.

Semiconductor components which have been produced on the basis of such rewiring substrate strips can be easily identified, especially since they have on opposite edges of their package cut rewiring lines which lead to the test contact surfaces on the cutting strips of the rewiring substrate after they have been separated to form semiconductor components. Such a semiconductor component has the advantage that it can still be intensively tested before encapsulation or coverage by means of a plastic compound so that it is either possible to identify and remove defective semiconductor chips before the packaging, or to retain the defective semiconductor chips but to mark them in such a manner that they can still be recognized and sorted out after they have been separated into individual semiconductor components.

A method for producing a rewiring substrate strip with several component groups which comprise semiconductor component positions with semiconductor chips, arranged in component rows in the x direction and in component columns in the y direction, comprises the following method steps.

Firstly, a substrate strip is provided which is metal-plated at least on its rear side. This metal plating is patterned to form a rewiring structure which comprises external contact patches in the semiconductor component positions and test contact surfaces in the area of cutting strips between the semiconductor component positions. Once such a rewiring structure has been produced, semiconductor chips are mounted in accordance with a predetermined plan on the top side of the rewiring substrate strip. First, each odd-numbered semiconductor component position in the component rows and the component columns is equipped with a first semiconductor chip in a first alignment A.

Following that, the remaining even-numbered semiconductor positions in the component columns and component rows are equipped with a second semiconductor chip, the second semiconductor chips uniformly having an alignment B rotated by 90° or uniformly having an alignment B rotated by 270° with respect to the first alignment A. In this arrangement, both the first semiconductor chips and second semiconductor chips can have completely identical integrated circuits. The first alignment A and the second alignment B have the effect that a rod-Parquet pattern is formed in accordance with a predetermined plan the x- and y-direction.

Following this, connections are produced between the semiconductor chips and the rewiring structure. After that, external contacts in the semiconductor component positions are applied to the external contact patches of the rewiring structure on the rear side of the rewiring substrate strip. This is followed by functional tests of the semiconductor chips of the semiconductor components with contacting of the test contact surfaces and/or of test contact surfaces and/or of plug-in contact surfaces of a plug-in contact strip. Finally, the defective semiconductor components on the rewiring substrate strip are marked.

This method has the advantage that, due to the additional test contact surfaces on the cutting strips in the component groups and the additional plug-in contact surfaces on edges of the rewiring substrate strip, functional tests of the semiconductor chips can be performed completely and in an improved manner without, however, having to contact the external contacts on the rewiring substrate strip. In addition, this method has the advantage that the internal signal processing in the semiconductor chips arranged in component groups can also be tested without requiring additional external contacts for the product package.

In consequence, using this method, components can be produced which have packages with reduced size, whilst at the same time reducing the number of external contacts, and which, nevertheless, can be subjected to a complete and improved functional test even for the internal signal processing. By arranging the plug-in contact strip, a "burn-in" test cycle method can also be performed directly with the aid of the rewiring substrate strip. The semiconductor components can thus be tested under extreme temperature cycle loading even before the component groups are separated into individual semiconductor components.

In this method according to the invention, these advantages, namely the gentle treatment of the external contacts of the product package, the extended testing and analysis capability of internal signal variations of all semiconductor chips and the testing of each component group with a number of semiconductor components within, for example, a plastic cover under extreme temperature fluctuations, become possible by means of the parketting pattern of the rewiring substrate strip according to the invention. When the semiconductor components are separated, the cutting strips with their test surfaces are cut out so that the product package remains small since the test contacts are jointly removed from the so-called debugging package.

A further variant of the method provides for the semiconductor chips to be mounted uniformly and with standard alignment on the top side of the rewiring substrate strip. For the rewiring structure, however, it is provided on the rewiring substrate strip that in the semiconductor component positions of the rewiring substrate strip, an alignment of the arrangement of external contacts compared with the alignment of semiconductor chips in the component rows and component columns for odd-numbered semiconductor component positions is provided uniformly rotated by 0° and/or 180° and for even-numbered semiconductor component positions in the component rows and the component columns rotated uniformly by 90° and/or uniformly by 270° with respect to the alignment of the semiconductor chips.

Thus, the different predetermined rotation in the even-numbered and the odd-numbered semiconductor component positions is carried out by means of a predetermined rewiring plan for a multi-layered rewiring substrate strip, preventing semiconductor chips from being twisted. This means that, although the multi-layered rewiring substrate strip has a more complex structure especially since it implements the required difference in rotation of arrangements of external contacts via correspondingly patterned rewiring lines and through-hole plated contacts, the advantage consists in that the equipping of the rewiring substrate strip in the component groups is simplified, especially since the semiconductor chips of a component group can remain uniformly aligned.

In a further variant of the performance of the method, a wafer separated into semiconductor chips is available for mounting differently aligned and arranged semiconductor chips on a rewiring substrate strip. This wafer comprises semiconductor chips aligned and arranged in a preparatory manner in x- and y-arrangement and in rotational alignment. These are mounted on the top side of the rewiring substrate strip in the predetermined arrangement and alignment of the wafer by an automatic insertion machine.

This method with a semiconductor wafer already prepared for being applied to the top side of a rewiring substrate strip has the advantage that the equipping of the rewiring substrate strip with semiconductor chips with different alignments can be performed without additional rotation by means of a standard automatic insertion machine in the component positions of a component group. The same advantage is obtained if in another variant of the performance of the method, a foil with semiconductor chips in a flat arrangement or a conveyor belt with linearly arranged semiconductor chips is available which comprise semiconductor chips aligned and arranged in a preparatory manner in x-, y-arrangement and/or in rotational alignment. The semiconductor chips can also be mounted on the top side of the rewiring substrate strip in the predetermined arrangement and alignment by means of a standard automatic insertion machine from such a foil or such a conveyor belt without any additional rotation.

A further variant of the method provides for an automatic insertion machine which is programmable in the x- and y-arrangement and rotational alignment to be used for mounting differently aligned and arranged semiconductor chips on the rewiring substrate strip. This automatic insertion machine picks up arranged and uniformly aligned semiconductor chips from a wafer separated into semiconductor chips or from a foil or from a conveyor belt uniformly equipped with semiconductor chips and applies them to the rewiring substrate strip according to program in accordance with a predetermined arrangement and alignment plan during the equipping of the rewiring substrate strip. Although this variant of the method requires greater expenditure for designing and constructing the programmable automatic insertion machine, the semiconductor chips can be provided in standardized manner on a wafer or on a foil in a conveyor belt.

In a further variant of the method, the semiconductor chips are equipped with flip chip contacts in the component groups. Connections between semiconductor chip and the rewiring substrate strip are established on the top side of the rewiring substrate strip for flip chip contacts by means of a soldering process. Applying semiconductor chips in this manner has the advantage that it may be possible to omit an embedment of the semiconductor chips with flip chip contacts in plastic. In addition, a soldering process is a parallel production step in which a multiplicity of electrical connections can be established at the same time between a rewiring structure of a rewiring substrate strip and flip chip contacts of semiconductor chips.

A further variant of the method provides for the semiconductor chips to be mounted with their rear sides on the semiconductor component positions. After that, connections between the semiconductor chips and a rewiring structure of the rewiring substrate strip are established by means of bonding technology. In this method, contact surfaces on the active top side of the semiconductor chip are connected to corresponding contact pads or bond fingers on the rewiring structure of the rewiring substrate strip by means of bonding wires. This is a serial process in which one bonding connection after another is successively applied and the bonding wires are then embedded in a plastic package compound with the semiconductor chips together and with coverage of the top side of the rewiring substrate strip in order to protect the bonding connections against damage.

To finish the test contact surfaces and/or the external contact patches, they can be selectively plated with a gold alloy. Such selective plating can be carried out by means of vapor deposition or sputtering by metallizing the entire surfaces of a component group of a rewiring structure after any patterned photoresist layer has first been applied. After that, the gold layer is removed by lifting or swelling the photoresist on surfaces which are not to be gold-plated. Another possibility consists in providing a metal plating on the substrate strip right from the start, which has a basic metallization, for example of copper, and has a plating of a gold alloy, in order to then pattern this multi-layer metal layer by means of wet etching or plasma removal by means of corresponding photolithographic steps.

If the test surfaces as such are not sufficient for corresponding contacting for the tests planned, solder balls can be soldered to the test contacts in a further variant of the performance of the method, before the tests are to be performed. Contacting the solder balls on the test contact surfaces also has the advantage that the external contact surfaces and/or the external contacts of the product package are protected.

Once a rewiring substrate strip has been produced and tested by means of the method and/or variants of the method described above, the rewiring substrate strip can be separated into individual semiconductor components and then the semiconductor components marked as defective can be sorted out.

In summary, it can be noted that in the substrate strip according to the invention, the space still available within a component group is used for additional test contact surfaces or test contacts. In this arrangement, separate surfaces are provided for the additional test contacts and test contact surfaces directly next to the semiconductor components. This part of the rewiring substrate strip in the form of cutting strips is removed by means of additional cutting lines when the rewiring substrate strip is separated into individual semiconductor components. The surface which can be additionally used in the cutting strips, is then also extended to a second direction by rotating the semiconductor components on the rewiring substrate strip so that the available surface is optimized, e.g. in the case of semiconductor components with connections at two edges. The available contact and wiring surface, which can be accessed by the automatic testing device is enlarged by rotating the semiconductor chips and by partially placing test contacts or test contact surfaces into the area outside the component group.

The process of providing cutting strips for test contact surfaces between the component rows and component columns and test contact surfaces outside the component group can be used jointly or separately depending on requirements on the rewiring substrate strips and the measuring technology.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
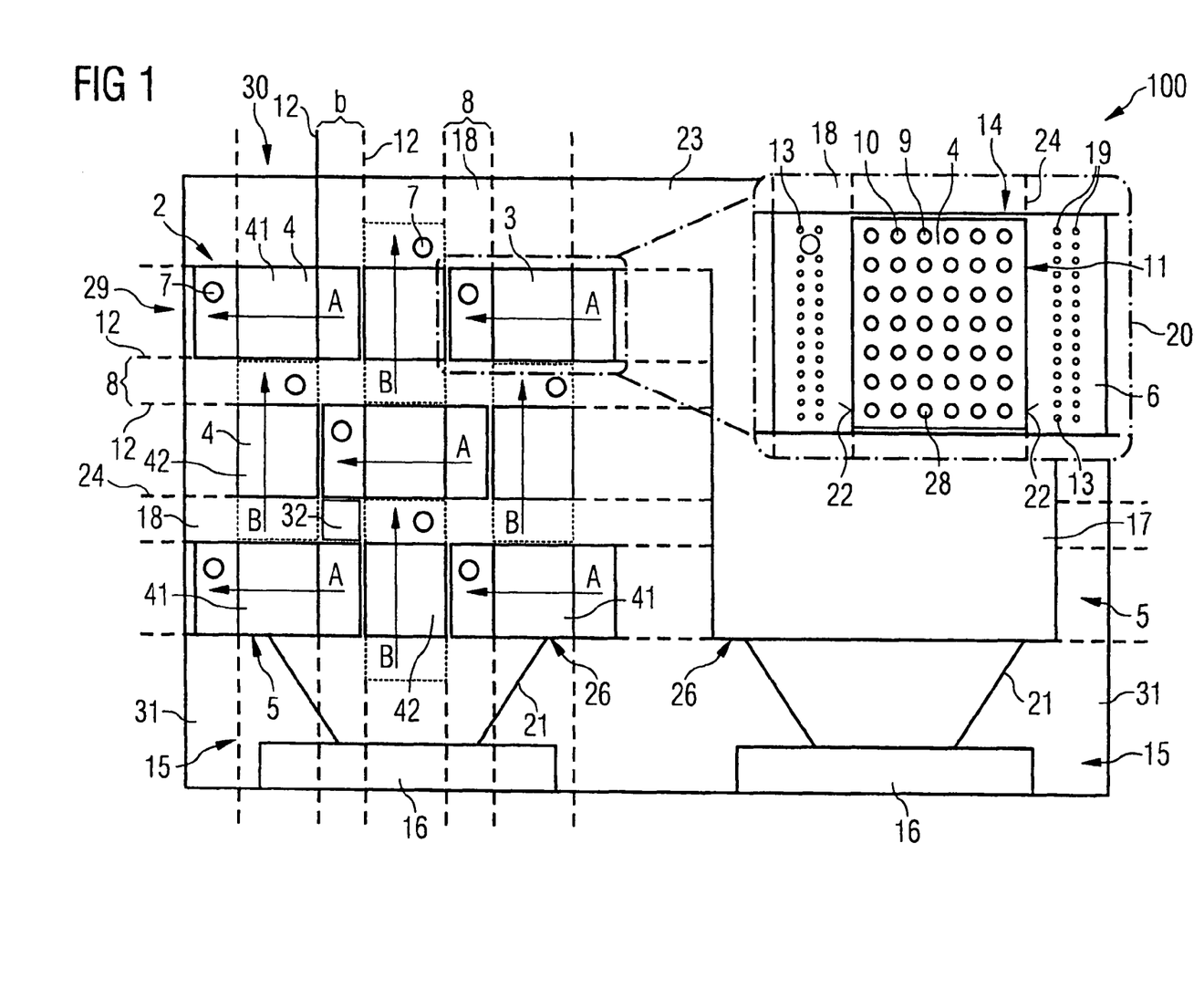
FIG. 1 illustrates a diagrammatic top view of a rewiring substrate strip according to a first embodiment of the invention.

FIG. 1 illustrates a diagrammatic top view of a substrate strip 23 of a rewiring substrate strip 100 according to a first embodiment of the invention. The right-hand part of the top view shows a closed plastic cover 17 which covers the area 26 of a component group 5. The details of the component group 5 are shown in the left-hand half of the picture on the rewiring substrate strip 100, the plastic cover 17 having been omitted. In this first embodiment of the invention, nine semiconductor components 3 are arranged under the plastic cover 17. The arrangement is structured in three component rows 29 and three component columns 30. The nine semiconductor components 3 are arranged on nine semiconductor component positions 2. The alignment of the semiconductor components 3 in the semiconductor component positions 2 is marked by marking points 7, a distinction having to be made between a first alignment A and an alignment B rotated by 90° with respect to the former.

Reference symbols 12 identify cutting lines by means of which the rewiring substrate strip 100 is separated into individual semiconductor components 3. Two cutting lines 12 in each case separate cutting strips 18 from the rewiring substrate strip 100. These have test contact surfaces 13 on the rear side 6 which is opposite to the top side 31, shown here, of the rewiring substrate strip 100. In the sectional enlargement 20 at the top right-hand edge of the picture, a section of the rear side 6 of a semiconductor component position with cutting strip 18 and test contact surfaces 13 which can carry test contacts 19 is shown.

The left-hand half of FIG. 1 illustrates the component group without the plastic cover 17 and thus exposes a view of the semiconductor chips 4 which have square areas in this embodiment of the invention and can be equipped with flip chip contacts. However, each semiconductor component position 2 is rectangular because cutting strip sections are added to the area of the semiconductor chips 4 on two opposite edges 22 of the semiconductor components 3. This rectangular area corresponds to a debugging package while the square area in each of the semiconductor component positions 2 identifies the size of a product package which is produced when the rewiring substrate strip 100 is separated apart along the cutting lines 12.

The area 8 of the cutting strips 18 provides an area for test contact surfaces 13 as can be seen in the sectional enlargement 20 which, however, do not belong to the product package when the rewiring substrate strip 100 is separated. As shown in the sectional enlargement 20, the test contact surfaces 13 on the rear side 6 are used for testing the operability of the semiconductor components 3 or, respectively, of the semiconductor chips 4 without damaging the external contacts 9 of the product package on the rear side 6 of the rewiring substrate strips 100.

The arrangements in the x- and y-direction of a component group 5 as shown on the left-hand half of FIG. 1 are characterized by the fact that the next neighbors of a semiconductor component arranged in a first alignment A have a second alignment B uniformly rotated by 90° or uniformly rotated by 270°. In the first embodiment of FIG. 1, test contact surfaces or test contacts are only provided on the cutting strip sections between the product packages and not on the intersection areas 32 of the cutting strips 18.

This first embodiment of the invention additionally comprises in an edge area 15 of the rewiring substrate strip 100 a plug-in contact strip 16 which is electrically connected to the test contact surfaces and/or the external contacts of the component group 5 via a bunch 21 of rewiring lines. This plug-in contact strip 16 is used for providing for temperature cycle tests such as a "burn-in" test simultaneously for one component group 5 in each case. The width b of a cutting strip depends on the number of rows of test contact surfaces 13 which are required for testing the semiconductor chips 4 in the semiconductor component positions.

In the embodiment according to FIG. 1, two rows of test contact surfaces 13 are provided on the cutting strips 18 on the rear side 6 of the rewiring substrate strip 100 as is shown in the sectional enlargement 20. The sectional enlargement 20 also shows that the external contacts 9 are arranged on the rear side 6 of the rewiring substrate strip 100 in each of the semiconductor component positions 2 in external contact rows 11 and external contact columns 14. Furthermore, the sectional enlargement 20 shows that the entire underside of the product package is covered by external contacts in a predetermined grid pitch with predetermined step size in matrix form. In this embodiment of the invention, the external contacts 9 are solder balls 28 soldered onto external contact patches 10.

The left-hand half of FIG. 1 also shows that in the component rows 29 and the component columns 30, first semiconductor chips 4 are in each case arranged with the alignment A on the odd-numbered semiconductor component positions 2, and second semiconductor chips 42 are arranged with the alignment B on even-numbered semiconductor component positions 2. This arrangement of the semiconductor components produces a parallel-rod Parquet pattern for the debugging package where, on the one hand, the square intersection areas 32 with the edge side b are characteristic and, on the other hand, the large rectangular areas of the respective associated debugging package characterize the Parquet pattern.

Figure 2:
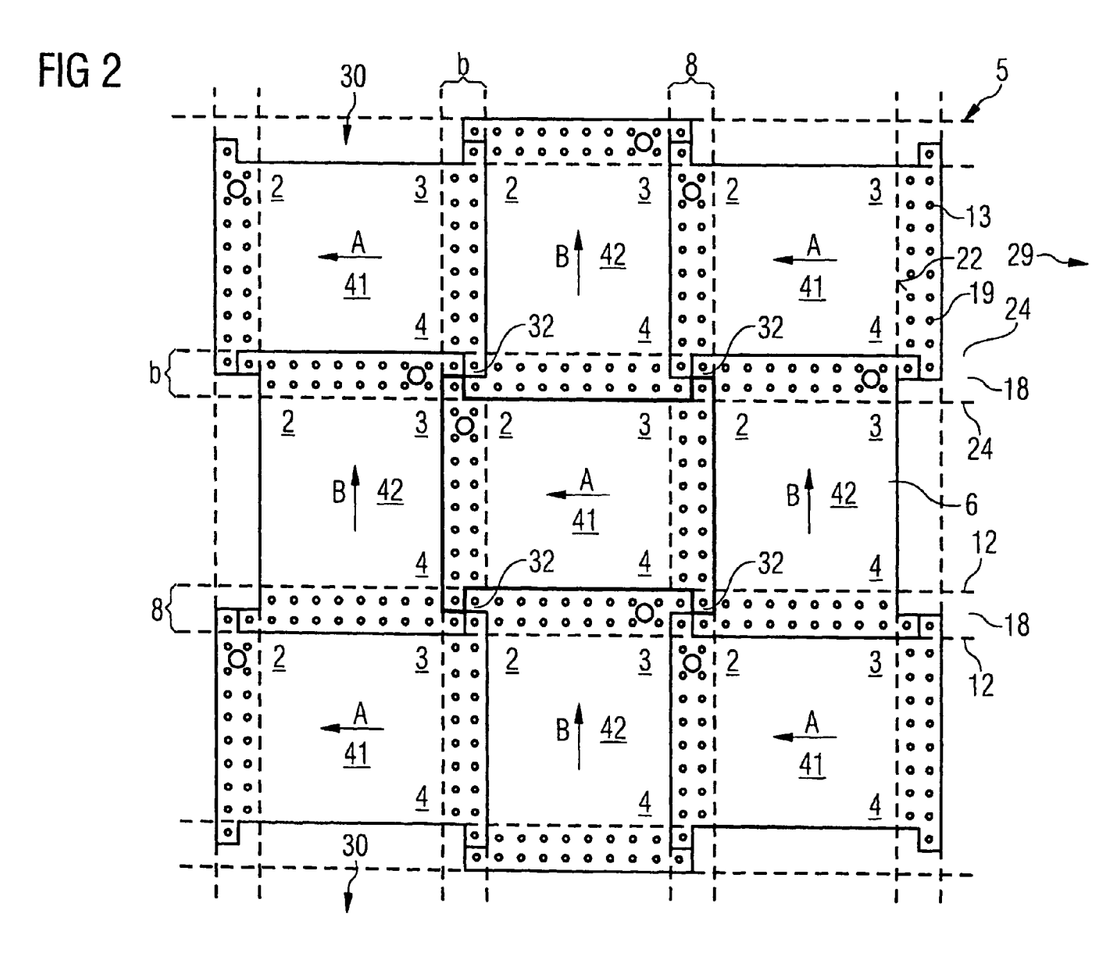
FIG. 2 illustrates a basic diagram of an arrangement of test contact surfaces of a component group of a rewiring substrate strip according to a second embodiment of the invention.

FIG. 2 illustrates a basic diagram of an arrangement of test contact surfaces 13 of a component group 5 of a rewiring substrate strip according to a second embodiment of the invention. Components having the same functions as in FIG. 1 are identified by the same reference symbols and will not be discussed especially.

In this second embodiment, the test contact surfaces 13 are also located on the rear side 6 of a rewiring substrate strip. The test contact surfaces 13 are arranged on the cutting strips 18 having the width b. However, the external contour of the debugging package is no longer rectangular but double-T-shaped. This special shape of the debugging package makes it possible to also exploit the intersection areas 32 of the cutting strips 18 for applying test contact surfaces 13. The test contact surfaces 13 are correlated in the intersection areas 32 in such a manner that a quarter of the number of the test contact surfaces 13 in the intersection areas 32 is added to in each case one of the adjacent debugging packages. By this means, the area of the cutting strips is utilized optimally and completely for arranging test contact surfaces. The alignments A and B, which are rotated by 90° to one another, and the alternating arrangement of first semiconductor chips 41 and second semiconductor chips 42 in the component rows 29 and component columns 30 is retained as in the first embodiment.

Figure 3:
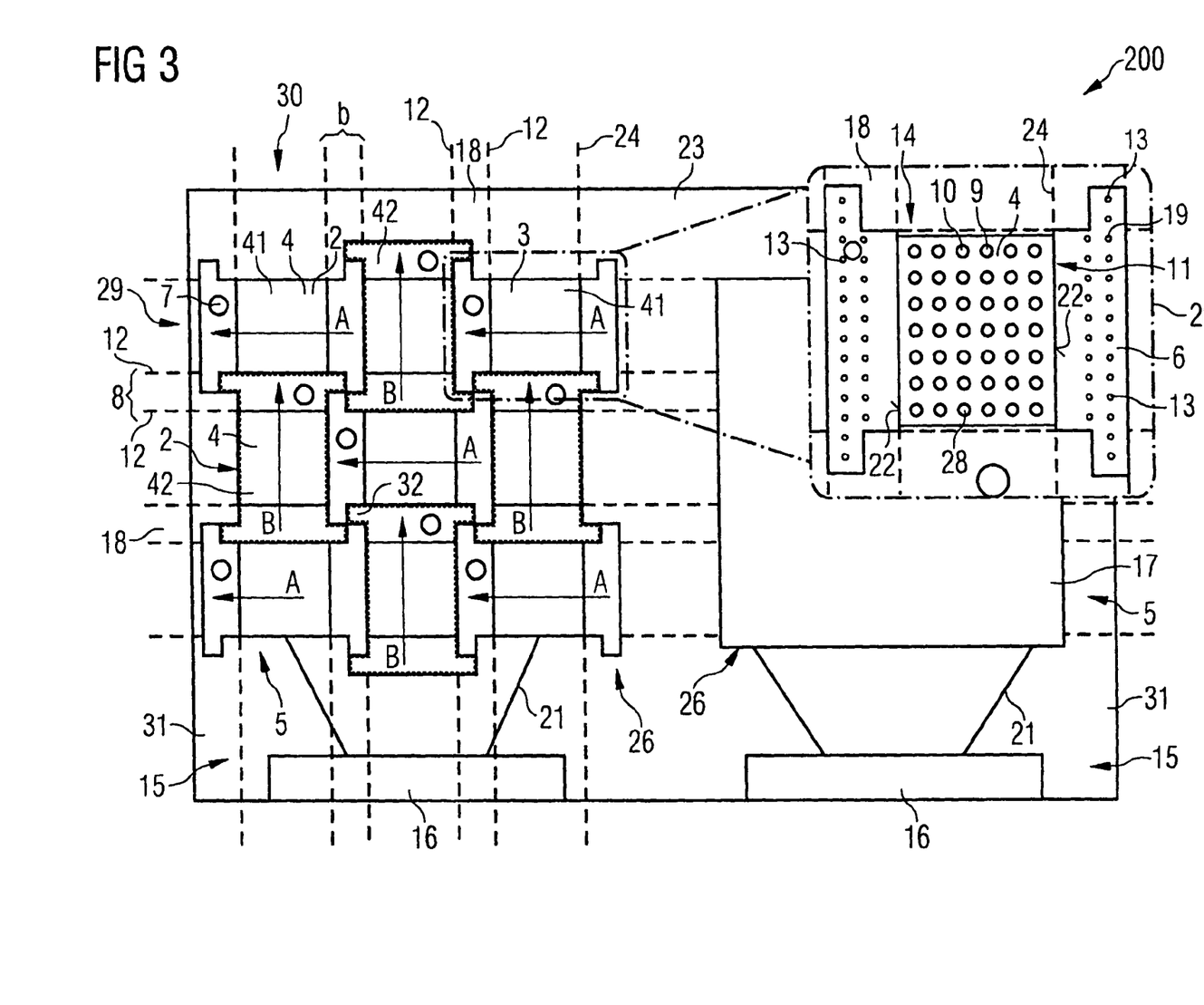
FIG. 3 illustrates a diagrammatic top view of a rewiring substrate strip of the second embodiment of the invention according to FIG. 2.

FIG. 3 a diagrammatic top view of a rewiring substrate strip 200 of the second embodiment of the invention according to FIG. 2. Components having the same functions as in the preceding figures are identified by the same reference symbols and will not be discussed especially.

FIG. 3 illustrates on the left-hand half of the picture, which is shown without plastic cover 17, the changed external contour of the debugging package which makes it possible to also utilize the intersection areas 32 for applying test contacts 13. The first alignment A of the first semiconductor chips 41 and the second alignment B of the second semiconductor chips 42 remains unchanged. Since the debugging packages per se are not separated, straight cutting lines 12 are also possible along the dashed lines 24 in order to cut square semiconductor components with corresponding external contacts 9 from the rewiring substrate strip 200.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A rewiring substrate strip comprising:
a plurality of semiconductor component positions for semiconductor components that are arranged in semiconductor chips arranged in several component rows and component columns subdivided by cutting lines;
wherein several semiconductor components positions are combined to form one component group, the component group comprising several semiconductor chips of the semiconductor components on a top side of the rewiring substrate strip; and
wherein cutting strips which have test contact surfaces are provided between the component rows and component columns within a component group, the semiconductor component positions and the test contact surfaces being aligned with respect to one another in such a manner that a parqueting pattern according to a parallel-rod Parquet pattern is produced and the arrangements of external contacts and test contact surfaces on a rear side of the rewiring substrate strip are correspondingly aligned with respect to one another in such a manner that the arrangements of four next neighbors of a semiconductor component are rotated by uniformly 90° or by uniformly 270° with respect to the one arrangement in accordance with a predetermined plan.

2. The rewiring substrate strip according to claim 1, comprising:
wherein the component rows and component columns comprise first and second semiconductor chips, the first and second semiconductor chips differing in their alignments and the first semiconductor chips having a first alignment and the second semiconductor chips having a second alignment rotated uniformly by 90° or uniformly by 270° with respect to the first alignment A, and the first and second semiconductor chips being arranged alternately in the component rows and component columns.

3. The rewiring substrate strip according to claim 1, comprising:
wherein on a rear side, opposite to the top side, of the rewiring substrate strip external contact patches having external contacts are arranged in the semiconductor component positions and wherein the external contact patches are electrically connected to the test contact surfaces on the cutting strips via rewiring lines.

4. The rewiring substrate strip according to claim 1, comprising:
where in the semiconductor component positions, the test contact surfaces on cutting strip sections which are arranged at two opposite edges of the semiconductor components are allocated to the respective semiconductor component position.

5. The rewiring substrate strip according to claim 1, comprising:
wherein the cutting strips are arranged horizontally along the component rows and vertically along the component columns, and in each case form an intersection area which comprises a number of test contact surfaces, a quarter of these test contact surfaces on an intersection area in each case being allocated to one of the four adjoining semiconductor component positions.

6. The rewiring substrate strip according to claim 1, comprising wherein one or more component groups are arranged in a row behind one another and/or next to one another on the rewiring substrate strip and preferably have one or more plastic covers.

7. The rewiring substrate strip according to claim 1, comprising where in the semiconductor component positions, external contact patches having external contacts are arranged in an external contact patch matrix with external contact rows and external contact columns.

8. The rewiring substrate strip according to claim 1, comprising wherein the semiconductor chips are electrically connected to the rewiring substrate strip via flip chip contacts or via bonding wire connections.

9. The rewiring substrate strip according to claim 1, comprising wherein the rewiring substrate strip has on its rear side, outside the area of a component group, areas with exposed test contact surfaces, the test contact surfaces being electrically connected to the test contact surfaces in the cutting strips and/or the external contact patches of the semiconductor components via rewiring lines.

10. The rewiring substrate strip according to claim 1, comprising wherein the rewiring substrate strip has in an edge area a plug-in contact strip with plug-in contact surfaces, the plug-in contact surfaces being electrically connected to the test contact surfaces and/or to test contact surfaces and/or the external contact patches.

11. The rewiring substrate strip according to claim 10, comprising wherein the plug-in contact strip of the rewiring substrate strip is provided for a temperature cycle test or, respectively, "burn-in" test.

12. The rewiring substrate strip according to claim 1, comprising wherein the test contact surfaces carry test contacts.

13. The rewiring substrate strip according to claim 1, comprising wherein the test contact surfaces comprise gold plating.

14. The rewiring substrate strip according to claim 1, comprising wherein the rewiring substrate strip has in the semiconductor component positions stacks of a logic chip and a memory chip, wherein both the memory functions of the memory chip and the logic functions of the logic chip can be tested via test contact surfaces and/or via exposed test contact surfaces and/or via test contacts and/or via plug-in contact strips.

15. A method for producing a rewiring substrate strip with several component groups, wherein the component groups comprise semiconductor component positions with semiconductor chips, the semiconductor component positions being arranged in component rows in the x-direction and in component columns in the y-direction, wherein the method comprises:
  providing a substrate strip which is metal-plated on its rear side;
  applying a rewiring structure on the metal-plated substrate strip, the rewiring structure comprising external contact patches in the semiconductor component positions and test contact surfaces in the area of cutting strips between the semiconductor component positions;
  mounting semiconductor chips on the top side of the rewiring substrate strip in the semiconductor component positions, in such a manner that first each odd-numbered semiconductor component position in the component rows and component columns is equipped with a first semiconductor chip in a first alignment and then the remaining even-numbered semiconductor component positions are equipped with a second semiconductor chip in a second alignment which is rotated uniformly by 90° or uniformly by 270° with respect to the first alignment, so that a rod-Parquet pattern is formed in accordance with a predetermined plan in the x- and y-direction;
  producing connections between the semiconductor chips and the rewiring structure;
  applying external contacts in the semiconductor component positions to the external contact patches of the rewiring structure on the rear side of rewiring substrate strip;
  performing functional tests of the semiconductor chips, combined into component groups, by contacting the test contact surfaces; and
  marking defective semiconductor components on the rewiring substrate strip.

16. The method according to claim 15, comprising wherein the semiconductor chips are mounted uniformly and with standard alignment on the top side of the rewiring substrate strip and a rewiring structure is provided on the rewiring lines which provides in the semiconductor component positions of the rewiring substrate strip an alignment of the arrangement of external contacts which is rotated uniformly by 0° and/or 180° for odd-numbered semiconductor component positions with respect to the alignment of the semiconductor chips in the component rows and the component columns and rotated uniformly by 90° and/or uniformly by 270° with respect to the alignment of the semiconductor chips for even-numbered semiconductor component positions, so that the predetermined rotation in the semiconductor component positions is carried out by means of a predetermined redistribution plan for a multi-layered rewiring substrate strip.

17. The method according to claim 16, comprising wherein for mounting differently aligned and arranged semiconductor chips on the rewiring substrate strip, a wafer separated into semiconductor chips is available which comprises semiconductor chips aligned and arranged in a preparatory manner in an x- and y-arrangement and in rotational alignment, which are mounted on the top side of the rewiring substrate strip in this predetermined arrangement and alignment of the wafer by an automatic insertion machine.

18. The method according to claim 17, comprising wherein for mounting differently aligned and arranged semiconductor chips on the rewiring substrate strip, a foil with semiconductor chips is available which comprises semiconductor chips aligned and arranged in a preparatory manner in the x- and y-arrangement and in rotational alignment, which are mounted on the top side of the rewiring substrate strip in this predetermined arrangement and alignment by an automatic insertion machine.

19. The method according to claim 18, comprising wherein for mounting differently aligned and arranged semiconductor chips on the rewiring substrate strip, an automatic insertion machine which is programmable in x-, y-arrangement and rotational alignment, is used which picks up semiconductor chips arranged in standard manner and uniformly aligned from a wafer separated into semiconductor chips or from a foil uniformly equipped with semiconductor chips and which carries out the provided arrangement and alignment plan according to program during the equipping of the rewiring substrate strip.

20. The method according to one of claim 19, comprising wherein the semiconductor chips in the component groups are semiconductor chips with flip chip contacts and connections between semiconductor chips and a rewiring structure are established on the top side of the rewiring substrate strip by means of a soldering process.

21. The method according to one of claim 20, comprising wherein the semiconductor chips are mounted with their rear sides on the semiconductor component positions and connections between semiconductor chips and a rewiring structure on the top side of the rewiring substrate strip are established by means of bonding technology.

22. The method according to one of claim 21, comprising wherein after the connections are established between semiconductor chips and rewiring substrate strip, plastic covers are applied to the component groups which embed the semiconductor chips in a plastic compound.

23. The method according to one of claims 22, comprising wherein the test contact surfaces and/or the external contact patches of the rewiring structure are selectively plated with a gold alloy.

24. The method according to one of claim 23, comprising wherein solder balls are soldered to the test contact surfaces as test contacts.

* * * * *